US009097990B2

(12) United States Patent
Van Der Toorn et al.

(10) Patent No.: US 9,097,990 B2
(45) Date of Patent: Aug. 4, 2015

(54) LITHOGRAPHIC APPARATUS AND STAGE SYSTEM

(75) Inventors: Jan-Gerard Cornelis Van Der Toorn, Eindhoven (NL); Marcel Koenraad Marie Baggen, Nuenen (NL); Stefan Geerte Kruijswijk, Eindhoven (NL); Jeroen Pieter Starreveld, Eindhoven (NL); Michael Johannes Vervoordeldonk, Rosmalen (NL); Mark Constant Johannes Baggen, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 321 days.

(21) Appl. No.: 13/403,706

(22) Filed: Feb. 23, 2012

(65) Prior Publication Data
US 2012/0242271 A1   Sep. 27, 2012

Related U.S. Application Data

(60) Provisional application No. 61/446,857, filed on Feb. 25, 2011.

(51) Int. Cl.
*G05B 13/00* (2006.01)
*G03F 7/20* (2006.01)

(52) U.S. Cl.
CPC ............ *G03F 7/70716* (2013.01); *G03F 7/709* (2013.01)

(58) Field of Classification Search
USPC ........ 318/561; 310/12.06; 355/30, 50, 55, 72, 355/73
See application file for complete search history.

(56) References Cited

U.S. PATENT DOCUMENTS

| 3,443,692 | A  | * | 5/1969  | Halsey ............................ 210/97 |
| 6,123,503 | A  | * | 9/2000  | Belanger et al. ............. 415/127 |
| 6,460,449 | B2 | * | 10/2002 | Higuchi et al. .................... 92/23 |
| 7,239,370 | B2 | * | 7/2007  | Jansen et al. .................... 355/53 |

(Continued)

FOREIGN PATENT DOCUMENTS

| CN | 1797212 A   | 7/2006 |
| JP | 2003-280744 | 10/2003 |
| TW | 200629013   | 8/2006 |

OTHER PUBLICATIONS

Taiwan Office Action dated May 7, 2014 in corresponding Taiwan Patent Application No. 101105488.

*Primary Examiner* — Rina Duda
*Assistant Examiner* — Bickey Dhakal
(74) *Attorney, Agent, or Firm* — Pillsbury Winthrop Shaw Pittman LLP

(57) ABSTRACT

A stage system includes an object table constructed to hold an object, a short stroke actuator element constructed to displace the object table over a first range of movement, and a long stroke actuator element constructed to displace the short stroke actuator element over a second range of movement which is larger than the first range of movement. The stage system further includes a pneumatic compensation device including: a sensor arranged to measure a quantity representative of a pneumatic disturbance force on the short stroke actuator element, an actuator arranged to provide a compensating force to at least partly compensate the pneumatic disturbance, and a controller. The sensor is connected to a controller input of the controller, the actuator is connected to a controller output of the controller, the controller being arranged to drive the actuator in response to a signal received from the sensor.

19 Claims, 7 Drawing Sheets

(56) References Cited

U.S. PATENT DOCUMENTS

| | | |
|---|---|---|
| 7,265,813 B2 | 9/2007 | Houkes et al. |
| 2005/0275822 A1* | 12/2005 | Butler .............................. 355/72 |
| 2006/0017894 A1* | 1/2006 | Van Empel et al. ............. 355/30 |
| 2006/0139613 A1* | 6/2006 | Houkes et al. .................. 355/72 |
| 2007/0206169 A1* | 9/2007 | Butler .............................. 355/53 |
| 2008/0074629 A1* | 3/2008 | Groeneveld et al. ............ 355/53 |
| 2009/0195763 A1 | 8/2009 | Butler et al. |

* cited by examiner

LITHOGRAPHIC APPARATUS AND STAGE SYSTEM

CROSS REFERENCE TO RELATED APPLICATIONS

This application claims priority and benefit under 35 U.S.C. §119(e) to U.S. Provisional Patent Application No. 61/446,857, entitled "Lithographic Apparatus and Stage System," filed on Feb. 25, 2011. The content of that application is incorporated herein in its entirety by reference.

FIELD

The present invention relates to a stage system and a lithographic apparatus comprising such stage system.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

The substrate is held by a substrate table, which is moved by an actuator so as to be able to irradiate consecutive parts of the surface of the substrate, e.g. using a stepping or scanning procedure. In a common implementation, the actuator comprises two main parts: a lower part (the so called long stroke) which is responsible for the coarse positioning and an upper part (the so called short stroke) which is responsible for the fine positioning. In order to optimize the performance of the short stroke, as little as possible disturbances shall act on the short stroke. This means that ideally no mechanical or other coupling exists between the long stroke and the short stroke, such that long stroke movements or deformations do not negatively impact the short stroke performance. Conventional designs have minimized the crosstalk by using a minimized number of very flexible connections, and actuation by a 6 degrees of freedom (DoF) Lorentz actuator system.

SUMMARY

It is desirable to provide an accurate short stroke positioning.

According to an embodiment of the invention, there is provided a stage system comprising:
an object table constructed to hold an object, a short stroke actuator element constructed to displace the object table over a first range of movement, a long stroke actuator element constructed to displace the short stroke actuator element over a second range of movement which is larger than the first range of movement, the stage system further comprising a pneumatic compensation device comprising:
a sensor arranged to measure a quantity representative of a pneumatic disturbance force on the short stroke actuator element, an actuator arranged to provide a compensating force to at least partly compensate the pneumatic disturbance, and a controller, the sensor connected to a controller input of the controller, the actuator connected to a controller output of the controller, the controller being arranged to drive the actuator in response to a signal received from the sensor.

In another embodiment of the invention, there is provided a stage system comprising:
an object table constructed to hold an object, a short stroke actuator element constructed to displace the object table over a first range of movement, a long stroke actuator element constructed to displace the short stroke actuator element over a second range of movement which is larger than the first range of movement, the stage system comprising a connection opening that connects a gap between the long stroke actuator element and the short stroke actuator element to an outside environment of the stage system to allow a gas to flow into and out of the gap via the connection opening.

According to a further embodiment of the invention, there is provided a stage system comprising: an object table constructed to hold an object, a short stroke actuator element constructed to displace the object table over a first range of movement, a long stroke actuator element constructed to displace the short stroke actuator element over a second range of movement which is larger than the first range of movement, an opening being provided through the long stroke actuator element, the opening extending from a gap between the short stroke actuator element and the long stroke actuator element towards a gap between the long stroke actuator element and a stationary structure.

According to a still further embodiment of the invention, there is provided a stage system comprising: an object table constructed to hold an object, a short stroke actuator element constructed to displace the object table over a first range of movement, a long stroke actuator element constructed to displace the short stroke actuator element over a second range of movement which is larger than the first range of movement, wherein the short stroke actuator element comprises a reinforcement rib, the reinforcement rib being provided with a through hole.

According to a yet still further embodiment of the invention, there is provided a lithographic apparatus comprising any of the above stage systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
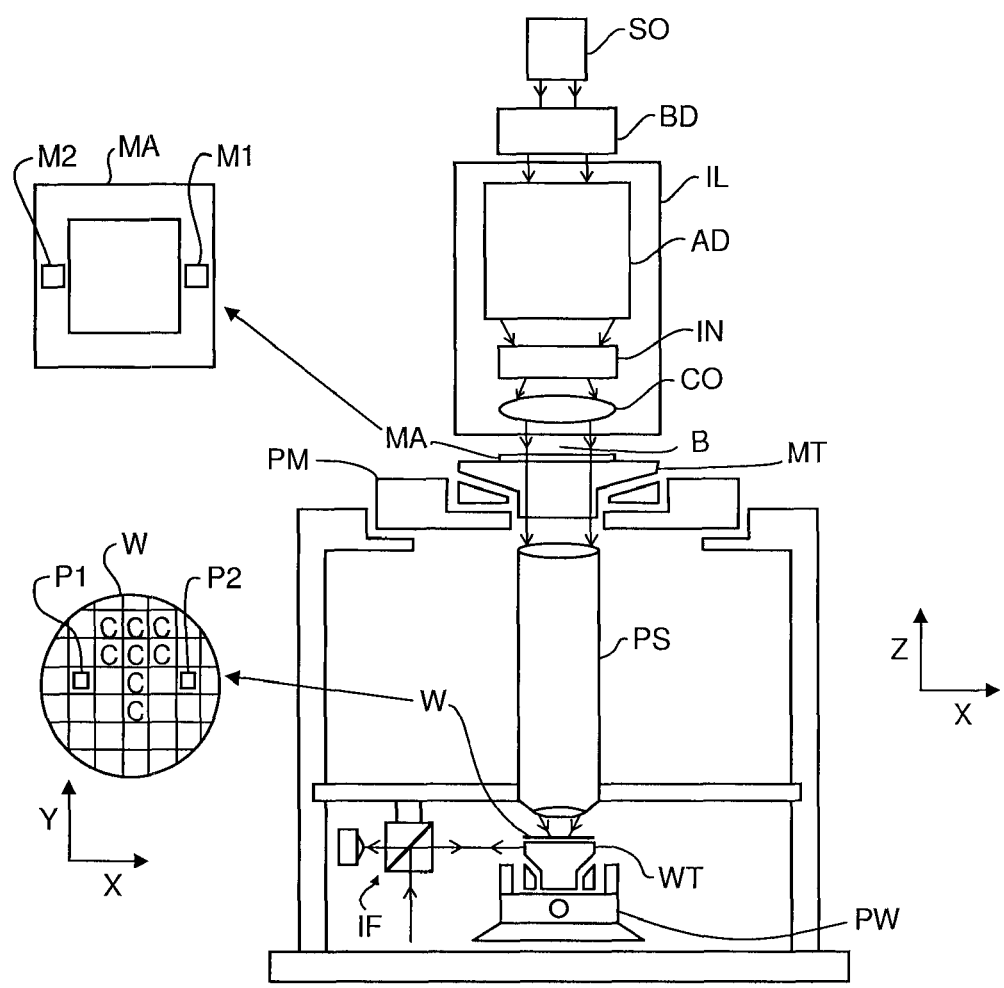
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure or a patterning device support (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the patterning device alignment marks may be located between the dies.

The depicted apparatus could be used in at least one of the following modes:

In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
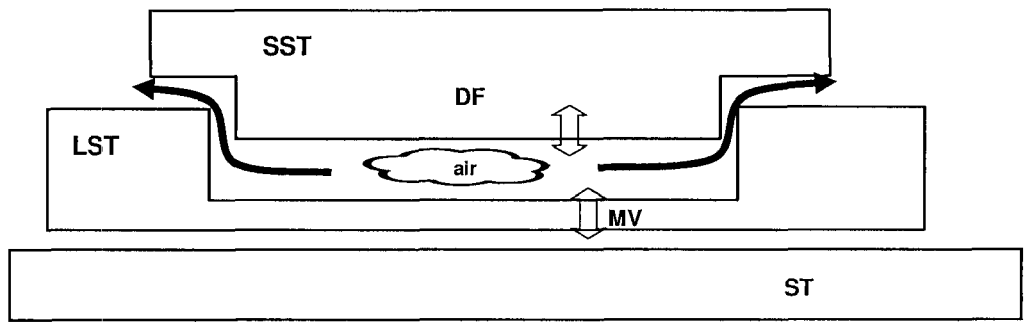
FIG. 2 depicts a schematic view of a stage system in order to illustrate a general concept of an embodiment of the invention.

FIG. 2 depicts a schematic side view of a stage system that comprises a short stroke actuator element SST and a long stroke actuator element LST. The short stroke actuator element is arranged to hold an object table to hold an object, such as a substrate table which is arranged to hold a substrate. The object table (not depicted in FIG. 2) may be provided on top of the short stroke actuator element or may form an integral part thereof. In the below, by way of example it will be assumed that the object table is a substrate table. It is however expressly noted that other applications are envisaged also, such as the object table being a support constructed to hold a patterning device. The short stroke actuator element provides (e.g. using a motor, such as a linear motor) a range of movement of the substrate table connected to it, in respect of the long stroke actuator element. The long stroke actuator element, which may also be provided with a linear or other motor, provides for a movement of the short stroke actuator element in respect of a stationary structure ST. The short stroke actuator element may hence generate an actuator force between the short stroke actuator element and the long stroke actuator element and the long stroke actuator element may generate an actuator force between the long stroke actuator element and the stationary structure ST. A range of movement of the short stroke actuator element is smaller than a range of movement of the long stoke actuator element. The long stoke actuator element may provide for a coarse positioning and the short stroke actuator element may provide for a fine positioning.

In lithographic machine or other applications, it is desirable to accurately position the substrate table, for which purpose position sensors may be provided on the short stroke and/or substrate table, such as optical encoders, interferometers, etc. In order to achieve a high accuracy, for example of the patterning by the irradiation beam in a lithographic apparatus, a high positioning accuracy of the substrate table, and hence of the short stroke actuator element, is desirable. A movement MV of the long stroke actuator element LST, such as in a vertical direction, may however provide for a pneumatic disturbance force via air (such as synthetic air, extremely clean dry air, nitrogen or any other gas mixture) on the short stroke actuator element SST, thereby providing for a disturbance force DF that may affect a position accuracy of the short stroke actuator element, hence of the substrate table.

Figure 3:
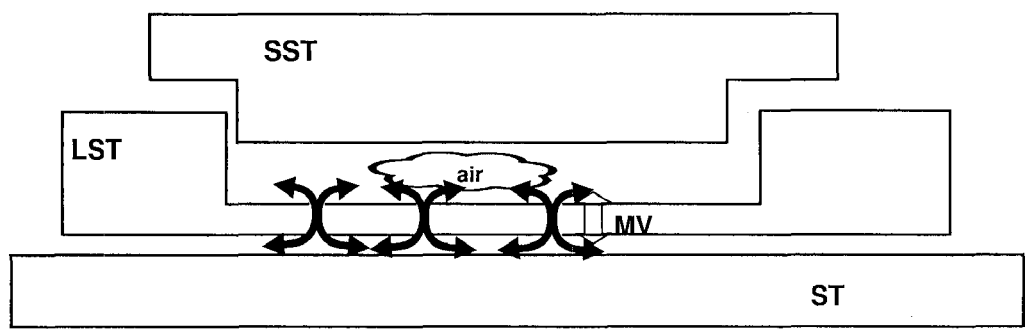
FIG. 3 depicts a schematic view of a stage system according to an embodiment of the invention.

FIG. 3 depicts a stage system as described above with reference to FIG. 2. The stage system according to an embodiment of the invention as depicted in FIG. 3 additionally comprises openings through the long stroke actuator element, the openings extending from a gap between the short stroke actuator element and the long stroke actuator element towards a gap between the long stroke actuator element and the stationary structure. In case of a movement MV of the long stroke actuator element, over pressure respectively under pressure build up in the respective gaps will effectuate a stream of the air through the openings that reduces over and under pressure thereby at least partly removing the disturbance on the short stroke actuator. It is noted that a movement of the long stroke actuator element LST in vertical direction will result in a pressure increase in one gap respectively a pressure decrease in the other gap, hence the described opening or openings allowing an effective "short circuiting" of such pressure disturbances, hence reducing a possible disturbance force on the short stroke actuator.

Figure 8A:
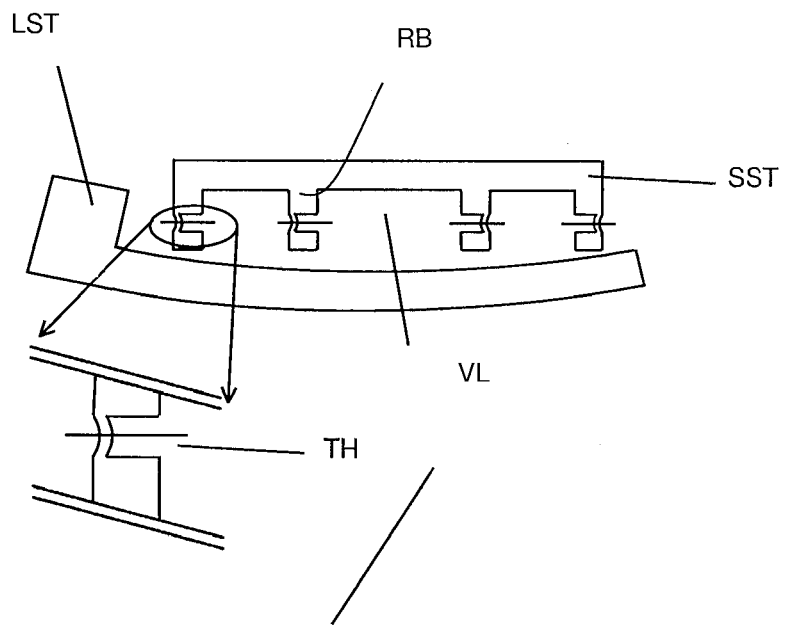
FIGS. 8A and 8B depict a schematic side view of a stage system according to an embodiment of the invention.
Figure 8B:
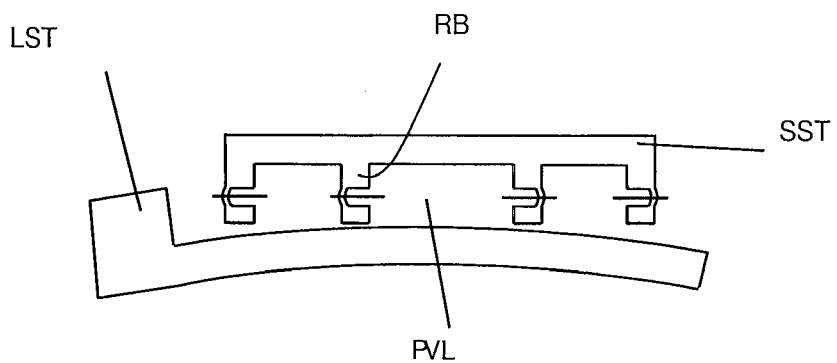
Figure 9:
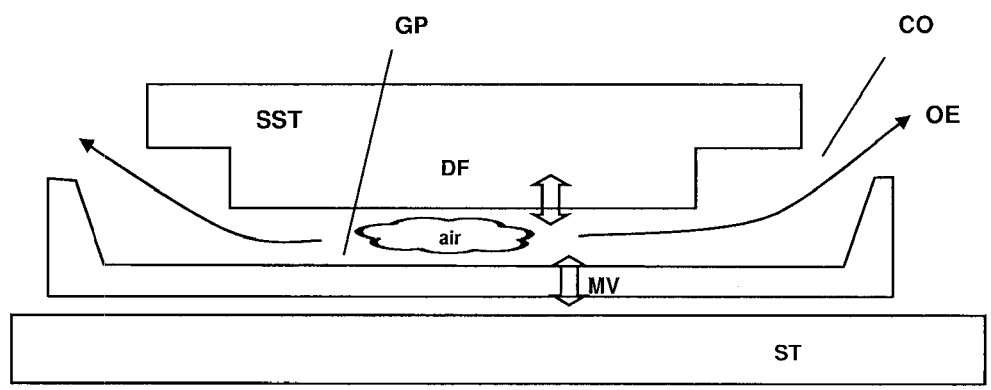
FIG. 9 depicts a schematic view of a stage system according to an embodiment of the invention.

Before discussing the embodiments as schematically indicated in FIGS. 3-6, possible embodiments of stage systems in accordance with embodiments of the invention are discussed referring to FIGS. 7-9.

Figure 7A:
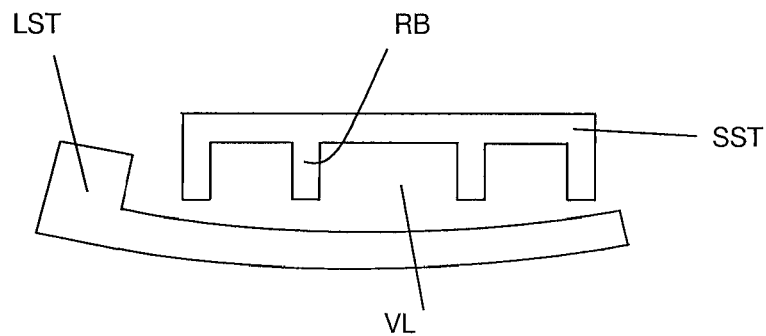
FIGS. 7A and 7B depict a schematic side view of a stage system in which an embodiment of the invention may be applied.
Figure 7B:
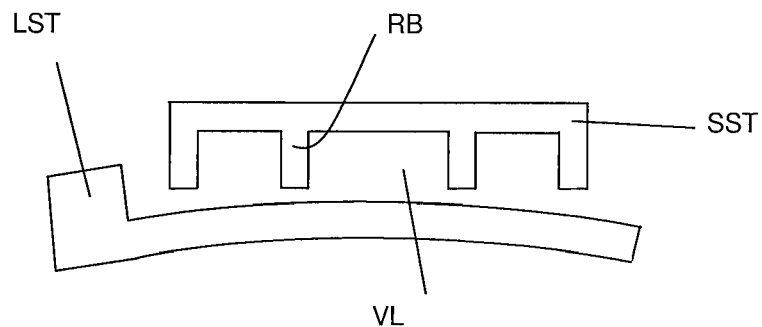

FIGS. 7A and 7B depict a highly schematic embodiment of a long stroke actuator element LST and a short stroke actuator element LST of a stage system according to an embodiment of the invention. The short stroke actuator element SST is provided with reinforcement ribs RB (depicted in FIGS. 7A and 7B in a highly schematic cross sectional view), which may for example result in a volume or volumes VL that is closed along five sides, and are open in a direction facing the long stroke actuator element only. FIGS. 7A and 7B show, for illustrative purposes in a highly exaggerated view, a bending mode of the long stroke actuator element, which bending mode may be excited during operation of the stage system. As a result of the bending of the long stroke actuator, the volume VL will be increased respectively decreased, resulting in a pneumatic disturbance on the short stroke actuator element, hence on the substrate table. It is noted that the long stroke actuator element may be provided with reinforcement ribs also.

A possible solution according to an embodiment is depicted in FIGS. 8A and 8B. In FIGS. 8A and 8B, the reinforcement ribs (or some of the reinforcement ribs) are provided with through holes TH, which for example extend in a direction parallel to the substrate table surface (or in a horizontal plane), so as to allow the pressure increase respectively decrease as discussed above with reference to FIGS. 7A and 7B to be at least partly prevented. An enlarged view of a through hole TH is depicted in FIG. 8A. The through holes may be open, however, in the depicted embodiment, the through holes are closed by a flexible membrane, so as to allow the effect described above, however "thermal pollution" due to air steams through the through holes may be prevented by the membranes so that for example heated air contained in the volumes VL may be kept in place thereby avoiding undesired dynamic temperature effects. It is noted that instead of the membranes, other flexible material may be applied. The through holes may have any suitable shape. It is noted that through holes may be provided in some, or in all reinforcement ribs of the short stroke actuator element. In case the long stroke actuator element is provided with reinforcement ribs, through holes may be provided in the long stroke actuator element similarly.

FIG. 9 depicts a highly schematic embodiment of a long stroke actuator element LST and a short stroke actuator element LST. The stage system comprises a connection opening CO that connects a gap GP between the long stroke actuator element LST and the short stroke actuator element SST to an outside environment OE of the stage system to allow a gas (e.g. air, synthetic air, extremely clean dry air, nitrogen) to flow into and out of the gap via the connection opening. In order to provide a low flow resistance, a cross sectional surface of the connection opening, i.e. a surface substantially perpendicular to a main in-stream or out-stream direction of air, may be equal to or larger than a cross sectional surface of the gap between the short stroke actuator element and the long stroke actuator element.

It is noted that in addition to or alternatively to the above embodiments, the long stroke actuator element, the short stroke actuator element or both may be constructed as a honeycomb structure or (partly) open framework so as to allow an easy flow in and out of the air and/or pressure settling.

In the above, "passive" possible solutions have been discussed with reference to FIGS. 3 and 7-9. So called "active" solutions will be discussed now with reference to FIGS. 4-6. In a general form of such a concept, the stage system comprises a pneumatic compensation device comprising: a sensor arranged to measure a quantity representative of a pneumatic disturbance force on the short stroke actuator element, an actuator arranged to provide a compensating force to at least partly compensate the pneumatic disturbance, and a controller, the sensor connected to a controller input of the controller, the actuator connected to a controller output of the controller, the controller being arranged to drive the actuator in response to a signal received from the sensor.

The controller may hence determine a suitable compensation from a measurement of the pneumatic disturbance force, and drive the actuator accordingly. Embodiments of the concept will be described below with reference to FIGS. 4-6.

Figure 4:
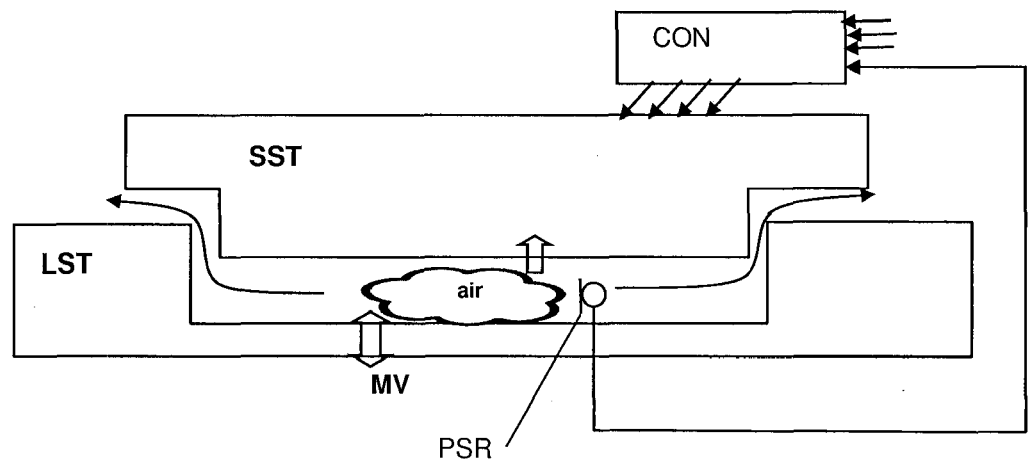
FIG. 4 depicts a schematic view of a stage system according to an embodiment of the invention.

FIG. 4 depicts a highly schematic view of a stage system according to an embodiment of the invention, the stage system comprising a long stroke actuator element LST and a short stroke actuator element LST. A pressure sensor PSR is provided, for example in the gap between the short stroke actuator element and the long stroke actuator element. A controller CON is provided, which may be a separate controller or which may be a controller that is also configured to position the short stroke actuator element and the substrate table. Thereto, inputs of the controller CON may be provided with position measurement data (such as from encoders, interferometers, etc) that measure a position (and possibly also velocity, acceleration etc.) of the substrate table (and/or short stroke actuator element) and outputs that drive the short stroke actuator element (and possibly the long stroke actuator element) actuators, such as motors, accordingly. The controller CON may be arranged to drive the actuators so as to position the short stroke actuator element at a desired position. The sensor may be connected to the long stroke actuator element (or to the short stroke actuator element) using a resilient connection so that a sensitivity of the sensor for mechanical effects, such as vibrations, acceleration, etc may be reduced, in order to provide that the sensor signal results substantially from the pneumatic effect only. A single sensor or a plurality of sensors may be provided, so as to obtain information about a spatial distribution of the pneumatic disturbance.

A position of the object table may be measured by position measurement sensors, the controller being arranged to drive the short stroke actuator element (and possibly the long stroke actuator element) from the measured object table position. An effective compensation of the pneumatic effects may be achieved by a modification of the measured object table position by means of the measured pneumatic disturbance. Thereto, the controller may be arranged to derive a position sensor correction signal from the signal as received from the sensor, derive a modified position signal of the object table from an object table position signal as measured by at least one object table position sensor, and the position sensor correction signal, and drive the short stroke actuator element based on the modified position signal of the object table. Thus, in an embodiment, an effective yet easy to implement correction may be provided, whereby the measured position of the object table is modified by a correction signal derived from the pneumatic disturbance, so as to drive the short stroke actuator element (and possibly long stroke actuator element) based on the measured position of the object table, modified by means of the measured pneumatic disturbance.

Other ways of suppressing mechanical effects, such as vibrations, acceleration, etc. may include a pressure sensor that comprises dual opposing pressure measurement devices and a processing circuit arranged to determine a sum and difference of output signals of the dual opposing pressure measurement devices. As the pressure measurement devices will be subjected to the same mechanical effects, such as acceleration and vibration, determining sum and difference of the two output signals may allow to distinct sensor output signal contributions from such mechanical effects from the to be detected pneumatic disturbance. Similarly, it is possible to provide dual pressure measurement devices and make one of them acoustically (i.e. pneumatically) closed (so that the pneumatic disturbance does not reach it), the one measurement device therefore substantially being responsive to other effects, such a the stated mechanical effects (acceleration and vibration) only, the processing circuit hence being arranged to apply the output signal from the acoustically closed pressure measurement device as a correction signal to correct the output signal of the other pressure measurement device.

The sensor may comprise any type of pressure sensor (static, dynamic, etc), for example a microphone or geophone.

The actuator that is driven by the controller may be the short stroke actuator element itself, i.e. the controller may drive the short stroke actuator element so as to generate a compensating force that at least partly compensates for the pneumatic disturbance. Thereby, no additional actuators are required.

Figure 5:
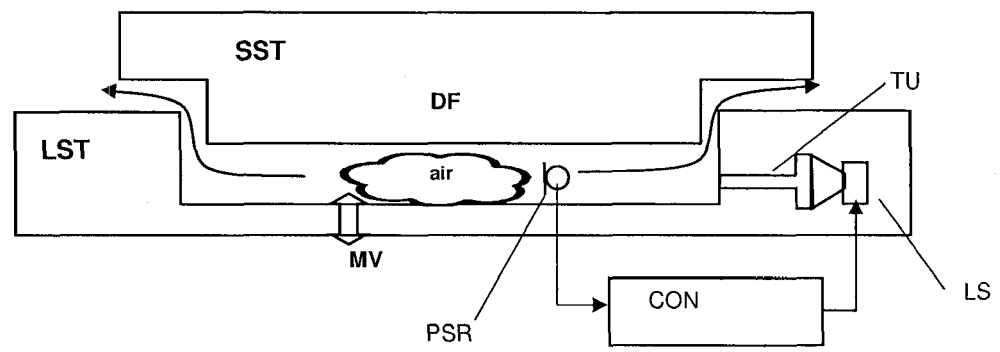
FIG. 5 depicts a schematic view of a stage system according to an embodiment of the invention.

An alternative actuator configuration is schematically depicted in FIG. 5. Here, instead of the controller driving the short stroke actuator, a pneumatic actuator, such as an acoustic transmitter, is provided. The acoustic transmitter LS, such as a loudspeaker, is connected to the gap between the long stroke actuator element LST and the short stroke actuator element LST using a connection tube TU, which may for example be tuned to a certain frequency band that substantially coincides with a frequency band in which the pneumatic disturbance effects may occur.

Figure 6:
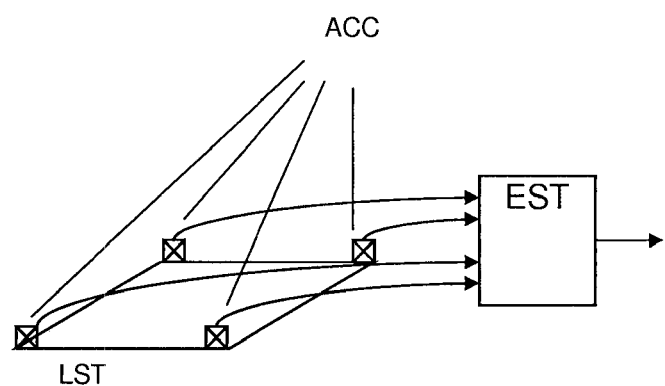
FIG. 6 depicts a schematic view of a stage system according to an embodiment of the invention.

A further configuration will now be described with reference to FIG. 6. Instead of measuring by the sensor (or sensors) a pneumatic disturbance, it is also possible that an acceleration of the long stroke actuator element is measured. Thereto, as schematically indicated in FIG. 6, a plurality of acceleration sensors ACC may be provided on or in the long stroke actuator element LST. As the pneumatic disturbances may in part result from excitation of bending and/or torsion modes of the long stroke actuator element, the acceleration sensors may be positioned substantially at a position of an antinode of such bending or torsion mode so as to be able to accurately determine an excitation thereof. An estimator EST may be provided to estimate a pressure variation from the measured acceleration. The estimator may be loaded with a predetermined model of the stage. Alternatively, a self learning estimator may be provided. The self learning estimator may applied, for example a model may be learned during use, whereby an effect of the movements of the long stroke actuator on the substrate table position may be minimized.

The multitude of accelerometers in the long stroke actuator element, known per se, measure the absolute acceleration of the long stroke actuator, for higher frequencies a very good measure for its position. From the acceleration signal, both the rigid-body motion of the long stroke actuator element with respect to the short stroke object table (e.g. encoder block) may be calculated, and, by using the redundancy of the multitude of sensors, the internal bending- and torsion modes of the long stroke actuator element are estimated. For each individual mode, the net disturbance force on the short stroke is determined (beforehand, or iteratively, or continuously learning). The modal state information is used by a controller, for each mode separately, to calculate the required feed-forward force on the short stroke actuator element, to minimize the pneumatic coupling effect of that mode.

The absolute acceleration (and deriving absolute position signal) is a valid measure for the relative distance between long stroke actuator element and short stroke actuator element, since the set-point of the short stroke actuator element is a nearly flat surface with respect to the metrology frame, which is typically at absolute stand-still, and this set-point is followed extremely well, with respect to the long stroke actuator element rigid-body and internal motion.

As accelerometers may already be present, the concept presented here could provide a low-impact solution. However, embodiments of the invention are not limited to using existing accelerometers. The benefit of using accelerometers over position sensors is that the accuracy and signal-to-noise ratio may be much better.

In an embodiment, the disturbance force DF acts an element of the stage system. As described above, the element may be the short stroke actuator system SST. Alternatively or additionally, the stage system is provided with a position sensor to measure the position of the stage. The position sensor may measure the position of the short stroke actuator element or the long stroke actuator element. The position sensor may be part of a position measurement system further comprising a reference. In an embodiment where the position sensor is an encoder head, the reference is a grid plate. The grid plate may be connected to a stationary part of the stage system, for example a metrology frame. Movement of the stage may cause a pneumatic disturbance on a part of the position measurement system, e.g. the grid plate. The grid plate may vibrate as a result, causing inaccurate measurements. To reduce the vibrations on part of the position measurement system, the pneumatic compensation device as described above may be applied. A sensor may be provided on or near the grid plate, or on the stage to measure the amount of disturbance. An actuator to compensate the disturbance may be applied on or near the grid plate or on the stage.

In an embodiment, the grid plate is arranged around a projection system on a metrology frame. When the centre of the stage is near the optical axis of the projection system, only a small surface of the stage faces the grid plate, because most of the surface faces the projection system. In this case, pneumatic disturbances act on only a small surface of the grid plate, resulting in relatively little deformation. However, when an edge of the stage is near the optical axis, a large surface of the stage faces the grid plates causing large deformations. To counter act this effect, one or more acoustic transmitters LS may be placed adjacent to the projection system or placed between the projection system and the grid plate.

Alternatively or additionally, passive components such as cavities or Helmholtz resonators may be placed adjacent to the projection system or placed between the projection system and the grid plate. These passive components can be tuned to dampen airmodes at certain frequencies. The advantage of passive components is that they are cheaper and inherently stabile, compared to the "active" solutions described above.

The stage system as described above with reference to FIGS. 2-9 may be applied in a lithographic apparatus, e.g. the object table being a substrate table constructed to hold a substrate and the object correspondingly being a substrate such as a wafer, or the object table being a mask table, i.e. a support constructed to support a patterning device, the object correspondingly being a patterning device.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A stage system comprising:
   an object table constructed to hold an object;
   a short stroke actuator element constructed to displace the object table over a first range of movement;
   a long stroke actuator element constructed to displace the short stroke actuator element over a second range of movement which is larger than the first range of movement, and
   a pneumatic compensation device comprising
      a sensor arranged to measure a quantity representative of a pneumatic disturbance force on an element of the stage system,
      an actuator arranged to provide a compensating force to at least partly compensate the pneumatic disturbance, and
      a controller arranged to drive the actuator in response to a signal received from the sensor, wherein the sensor is connected to a controller input of the controller and the actuator is connected to a controller output of the controller.

2. The stage system according to claim 1, wherein the element is the short stroke actuator element.

3. The stage system according to claim 1, comprising a position measurement system configured to measure a position of one of the short stroke actuator element and the long stroke actuator element, wherein the element is a part of the position measurement system.

4. The stage system according to claim 1, wherein the sensor comprises a pressure sensor.

5. The stage system according to claim 4, wherein the pressure sensor is resiliently mounted to the long stroke actuator element.

6. The stage system according to claim 4, wherein the pressure sensor comprises dual opposing pressure measurement devices and a processing circuit arranged to determine a sum and a difference of output signals of the dual opposing pressure measurement devices.

7. The stage system according to claim 4, wherein the pressure sensor comprises dual pressure measurement devices, a first of the dual pressure measurement devices being acoustically closed, and a processing circuit arranged to apply an output signal of the acoustically closed pressure measurement device as a correction signal to correct an output signal of a second of the dual pressure measurement devices.

8. The stage system according to claim 1, wherein the sensor comprises an accelerometer.

9. The stage system according to claim 8, wherein the accelerometer is positioned substantially at a position of an anti-node of a bending mode or torsion mode of the object table.

10. The stage system according to claim 8, wherein the controller comprises an estimator arranged to determine a pressure variation from the acceleration as measured by the accelerometer.

11. The stage system according to claim 10, wherein the estimator is a self learning estimator.

12. The stage system according to claim 1, wherein the actuator is the short stroke actuator element.

13. The stage system according to claim 12, wherein the controller is arranged to derive a position sensor correction signal from the signal as received from the sensor, derive a modified position signal of the object table from an object table position signal as measured by at least one object table position sensor, and the position sensor correction signal, and drive the short stroke actuator element based on the modified position signal of the object table.

14. The stage system according to claim 1, wherein the actuator is an acoustic transmitter.

15. A stage system comprising:
   an object table constructed to hold an object;
   a short stroke actuator element constructed to displace the object table over a first range of movement;
   a long stroke actuator element constructed to displace the short stroke actuator element over a second range of movement which is larger than the first range of movement, and
   a connection opening that connects a gap between the long stroke actuator element and the short stroke actuator element to an outside environment of the stage system to allow a gas to flow into and out of the gap via the connection opening, wherein a cross sectional surface of the connection opening is equal to or larger than a cross sectional surface of the gap between the short stroke actuator element and the long stroke actuator element.

16. A stage system comprising:

an object table constructed to hold an object;

a short stroke actuator element constructed to displace the object table over a first range of movement;

a long stroke actuator element constructed to displace the short stroke actuator element over a second range of movement which is larger than the first range of movement, and an opening being provided through the long stroke actuator element, the opening extending from a gap between the short stroke actuator element and the long stroke actuator element towards a gap between the long stroke actuator element and a stationary structure.

17. The stage system according to claim 16, wherein the opening is closed by a flexible material.

18. The stage system according to claim 17, wherein the flexible material is a membrane.

19. A lithographic apparatus comprising:

a projection system configured to project a patterned radiation beam onto a substrate, and a stage system comprising an object table constructed to hold an object;

a short stroke actuator element constructed to displace the object table over a first range of movement;

a long stroke actuator element constructed to displace the short stroke actuator element over a second range of movement which is larger than the first range of movement, and a pneumatic compensation device comprising a sensor arranged to measure a quantity representative of a pneumatic disturbance force on an element of the stage system, an actuator arranged to provide a compensating force to at least partly compensate the pneumatic disturbance, and a controller arranged to drive the actuator in response to a signal received from the sensor, wherein the sensor is connected to a controller input of the controller and the actuator is connected to a controller output of the controller.

* * * * *